(12) United States Patent
Zhang et al.

(10) Patent No.: US 9,704,959 B2
(45) Date of Patent: Jul. 11, 2017

(54) ENHANCEMENT-MODE TRANSISTORS WITH INCREASED THRESHOLD VOLTAGE

(71) Applicant: Massachusetts Institute of Technology, Cambridge, MA (US)

(72) Inventors: Yuhao Zhang, Cambridge, MA (US); Tomas Apostol Palacios, Belmont, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 14/284,135

(22) Filed: May 21, 2014

(65) Prior Publication Data

US 2014/0346615 A1  Nov. 27, 2014

Related U.S. Application Data

(60) Provisional application No. 61/825,694, filed on May 21, 2013.

(51) Int. Cl.
| | | |
|---|---|---|
| *H01L 29/40* | (2006.01) | |
| *H01L 29/423* | (2006.01) | |
| *H01L 21/28* | (2006.01) | |
| *H01L 29/51* | (2006.01) | |
| *H01L 29/78* | (2006.01) | |

(Continued)

(52) U.S. Cl.
CPC ...... *H01L 29/408* (2013.01); *H01L 21/28158* (2013.01); *H01L 29/4232* (2013.01); *H01L 29/513* (2013.01); *H01L 29/517* (2013.01); *H01L 29/66462* (2013.01);

(Continued)

(58) Field of Classification Search
CPC ............ H01L 21/28158; H01L 29/408; H01L 29/513; H01L 29/517; H01L 29/4232; H01L 29/66462; H01L 29/7787; H01L 29/78

See application file for complete search history.

(56) References Cited

U.S. PATENT DOCUMENTS 6,191,463 B1 * 2/2001 Mitani ............ H01L 21/28176
257/410
7,326,971 B2  2/2008 Harris et al.
(Continued)

FOREIGN PATENT DOCUMENTS

CN   102184943    *   9/2011
CN   102184943 A  *   9/2011
(Continued)

OTHER PUBLICATIONS

International Search Report and Written Opinion issued on Sep. 9, 2014 by the European Patent Office in the international application No. PCT/US2014/038996, filed on May 21, 2014, 10 pages.
(Continued)

*Primary Examiner* — Jarrett Stark
*Assistant Examiner* — Bitew Dinke
(74) *Attorney, Agent, or Firm* — Wolf, Greenfield & Sacks, P.C.

(57) ABSTRACT

A field effect transistor that has a source, a drain, a gate, a semiconductor region, and a dielectric region. The dielectric region is located between the semiconductor region and the gate. Negatively charged ions are located within the dielectric layer underneath the gate.

19 Claims, 14 Drawing Sheets

(51) Int. Cl.
*H01L 29/66* (2006.01)
*H01L 29/778* (2006.01)
*H01L 29/20* (2006.01)

(52) U.S. Cl.
CPC .......... *H01L 29/7787* (2013.01); *H01L 29/78* (2013.01); *H01L 29/2003* (2013.01)

(56) References Cited

U.S. PATENT DOCUMENTS

| | | | |
|---|---|---|---|
| 7,382,001 B2 | 6/2008 | Beach | |
| 7,932,539 B2 | 4/2011 | Chen et al. | |
| 7,955,918 B2 | 6/2011 | Wu et al. | |
| 8,114,717 B2 | 2/2012 | Palacios et al. | |
| 8,399,911 B2 | 3/2013 | Derluyn et al. | |
| 8,564,020 B2* | 10/2013 | Chen et al. | 257/194 |
| 9,263,270 B2* | 2/2016 | Zaka | H01L 21/265 |
| 2006/0273401 A1* | 12/2006 | Tsujikawa | H01L 21/823857 257/369 |
| 2006/0273412 A1* | 12/2006 | Tamura | H01L 21/28185 257/410 |
| 2007/0026587 A1* | 2/2007 | Briere | 438/159 |
| 2007/0224710 A1* | 9/2007 | Palacios et al. | 438/12 |
| 2007/0278518 A1* | 12/2007 | Chen et al. | 257/192 |
| 2008/0135880 A1* | 6/2008 | Yoshida et al. | 257/194 |
| 2008/0157228 A1* | 7/2008 | Chambers | H01L 21/28079 257/407 |
| 2008/0258229 A1* | 10/2008 | Ohkawa | H01L 21/823857 257/369 |
| 2009/0032820 A1* | 2/2009 | Chen | 257/76 |
| 2010/0013021 A1* | 1/2010 | Chen | H01L 21/2652 257/369 |
| 2011/0018002 A1* | 1/2011 | Chen | H01L 21/28575 257/76 |
| 2011/0049530 A1* | 3/2011 | Dhar et al. | 257/77 |
| 2011/0103148 A1 | 5/2011 | Bhalla et al. | |
| 2011/0121313 A1* | 5/2011 | Briere | 257/76 |
| 2012/0122281 A1 | 5/2012 | Chang et al. | |
| 2012/0146134 A1* | 6/2012 | Kamada | H01L 29/7787 257/330 |
| 2013/0001646 A1 | 1/2013 | Corrion et al. | |
| 2013/0105808 A1* | 5/2013 | Wong et al. | 257/76 |
| 2013/0113053 A1 | 5/2013 | Lin et al. | |
| 2013/0256686 A1* | 10/2013 | Kanamura | H01L 29/205 257/76 |
| 2014/0091308 A1 | 4/2014 | Dasgupta et al. | |

FOREIGN PATENT DOCUMENTS

| | | |
|---|---|---|
| CN | 102709322 | 10/2012 |
| GB | 2028582 | 3/1980 |
| WO | 2009/038809 A1 | 3/2009 |

OTHER PUBLICATIONS

Adivarahan, V. et al., IEEE Electron Device Lett. 26, 535 (2005).
Chang, C.T. et al., Electron. Lett. 46, 1280 (2010).
Chen, C. et al., "Fabrication of Enhancement-Mode AlGaN/GaN MISHEMTs by Using Fluorinated as Gate Dielectrics." Electron Device Letters, IEEE 32.10 (2011): 1373-1375.
Esposto, M. et al., Appl. Phys. Lett. 99, 133503 (2011).
Ganguly, S. et al., Appl. Phys. Lett. 99, 193504 (2011).
Kambayashi, H. et al., Solid-State Electron. 54, 660 (2010).
Kanamura, M. et al., IEEE Electron Device Lett. 31, 189 (2010).
Khalil, S. G. et al., *Proceedings of the 42th European Solid-State Device Research Conference*, Bordeaux, France, Sep. 17-21, 2012, pp. 310-313.
Liu, Z. H. et al, Appl. Phys. Left. 95, 223501 (2009).
Lu, B. et al., IEEE Electron Device Lett. 31, 990 (2010).
Lu, B. et al., IEEE Electron Device Lett. 33, 360 (2012).
Shin, B. et al., Appl. Phys. Lett. 96, 152908 (2010).
Uemoto, Y. et al. "Gate Injection Transistor (GIT)—A Normally-Off AlGaN/GaN Power Transistor Using Conductivity Modulation," IEEE Trans. on Electron Devices, vol. 54, pp. 3393-3399, 2007.
Wang, R. et al., IEEE Electron Device Lett. 27, 793 (2006).
Zhang, Y., "Simulation and Fabrication of GaN-Based Vertical and Lateral Normally-off Power Transistors," Master Thesis, Massachusetts Institute of Technology, 2013.

* cited by examiner

ENHANCEMENT-MODE TRANSISTORS WITH INCREASED THRESHOLD VOLTAGE

CROSS-REFERENCE TO RELATED APPLICATIONS

This application claims priority to U.S. provisional application Ser. No. 61/825,694, titled "Enhancement-mode MOS Semiconductor Transistors with High Threshold Voltage," filed May 21, 2013, which is hereby incorporated by reference in its entirety.

BACKGROUND

1. Field of Invention

The technology described herein relates to semiconductor devices, and particularly to increasing the threshold voltage of transistors, such as nitride semiconductor transistors, for example.

2. Discussion of the Related Art

Improved power transistors are desired for advanced transportation systems, more robust energy delivery networks and new approaches to high-efficiency electricity generation and conversion. Applications of power transistors include power supplies, automotive electronics, automated factory equipment, motor controls, traction motor drives, high voltage direct current (HVDC) electronics, lamp ballasts, telecommunications circuits and display drives, for example. Such systems rely on efficient converters to step-up or step-down electric voltages, and use power transistors capable of blocking large voltages and/or carrying large currents. In hybrid vehicles, for example, power transistors with blocking voltages of more than 500 V are used to convert DC power from the batteries to AC power to operate the electric motor.

Conventional power devices (e.g., transistors or diodes) used in such applications are made of silicon. However, the limited critical electric field of silicon and its relatively high resistance causes available commercial devices, circuits and systems to be very large and heavy, and operate at low frequencies. Therefore, such commercial devices are unsuitable for future generations of hybrid vehicles and other applications.

Nitride semiconductor devices have been proposed as offering the potential for producing high-efficiency power electronics demanding high blocking voltages and low on-resistances.

SUMMARY

Some embodiments relate to a field effect transistor that includes a source, a drain, a gate between the drain and the source, a semiconductor region under the gate, and a dielectric region between the gate and the semiconductor region. The dielectric region has a first surface on a first side of the dielectric region nearest the gate and a second surface on a second side of the dielectric region nearest the semiconductor region. At least a portion of the dielectric region comprises a chemical species to neutralize positive charges of the dielectric region. The chemical species includes negatively charged ions and/or electronegative chemical species. A concentration of the chemical species in the at least a portion of the dielectric region increases along a line from the first surface to the second surface or is uniform between the first surface and the second surface.

Some embodiments relate to a field effect transistor that includes a source, a drain, a gate, a semiconductor region under the gate and a dielectric region between the gate and the semiconductor region. At least a portion of the dielectric region includes negatively charged ions. A concentration of the negatively charged ions in the at least a portion of the dielectric region increases with proximity to the semiconductor region.

Some embodiments relate to a method of forming a field effect transistor. The method includes forming a dielectric region over a semiconductor region and a gate over the dielectric region. The dielectric region has a first surface on a first side of the dielectric region nearest the gate and a second surface on a second side of the dielectric region nearest the semiconductor region. At least a portion of the dielectric region includes negatively charged ions. A concentration of the negatively charged ions in the at least a portion of the dielectric region increases along a line from the first surface to the second surface.

The foregoing summary is provided by way of illustration and is not intended to be limiting.

BRIEF DESCRIPTION OF DRAWINGS

In the drawings, each identical or nearly identical component that is illustrated in various figures is represented by a like reference character. For purposes of clarity, not every component may be labeled in every drawing. The drawings are not necessarily drawn to scale, with emphasis instead being placed on illustrating various aspects of the techniques described herein.

DETAILED DESCRIPTION

Figure 1:
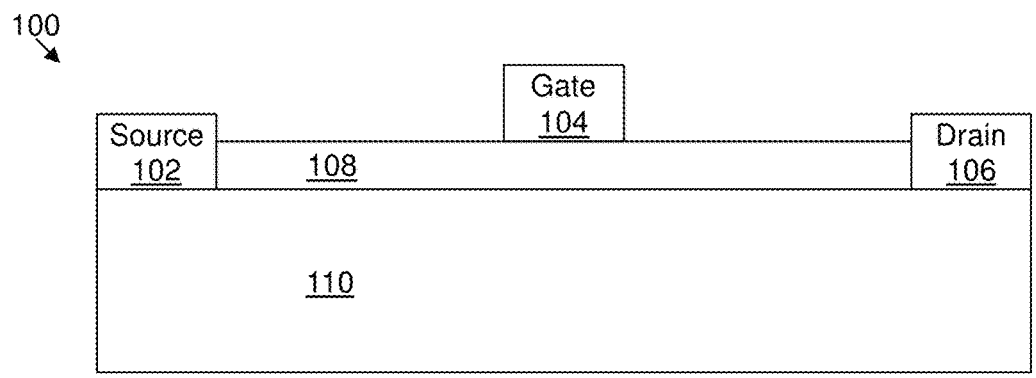
FIG. 1 shows an exemplary semiconductor device with a gate dielectric.

In spite of the tremendous potential of nitride transistors in high efficiency power applications, there are still several technical problems to be resolved. One of the most challenging problems is the reliable formation of normally-off transistors, also referred to herein as enhancement mode or E-mode transistors. Many nitride power transistors, such as standard AlGaN/GaN high-electron-mobility transistors (HEMTs), are depletion-mode (D-mode) transistors. Depletion mode transistors are normally on in the sense that they allow current to flow when no voltage is applied to the gate. Enhancement mode transistors are normally off, as they do not allow current to flow in the absence of an applied gate voltage. Enhancement-mode nitride transistors with a sufficiently high threshold voltage Vth (e.g., Vth of at least about 0.5 V) are desirable to simplify circuit design and to enable fail-safe operation in power electronics. Enhancement mode metal-oxide-semiconductor (MOS) nitride transistors such as MOS-HEMTs (High Electron Mobility Transistors) have been developed by combining a MOS gate structure with various techniques, including gate-recess, dual-gate integration, a tri-gate structure and fluorine plasma treatment. The use of a gate oxide can suppress the gate leakage, improves the channel transport characteristics and device stability, and has also been expected to facilitate a more positive Vth by capacitance modulation. However, it has been shown that the Vth in MOS nitride transistors (for example GaN MOS-HEMTs) hardly increases, in fact sometimes decreases, with the deposition of a thick gate dielectric, due to the presence of positive charges in the gate dielectric or at the interface between the gate dielectric and the nitride semiconductor material. When the gate dielectric is formed positive charges are introduced into the gate dielectric material or at its surface that reduce the threshold voltage of the transistor. The threshold voltage may be reduced to such a degree that the transistor does not operate as a normally-off transistor as designed. This has been a challenge in the design and fabrication of high-Vth E-mode nitride transistors.

In some embodiments, the presence of positive charges in the gate dielectric can be counteracted or neutralized by the introduction of negatively charged ions or highly electronegative chemical species into the gate dielectric. When introduced into the structure, the negatively-charged ions may capture charge or bond with the surrounding material. The description herein relating to "negatively charged ions" applies to a chemical species that may be introduced as negatively charged ions and which may undergo a change of charge state and/or bond upon being introduced into the structure. Introducing negatively charged ions into the gate dielectric can increase the threshold voltage of nitride transistors to a value suitable for normally-off operation. In some embodiments, the threshold voltage can be increased to greater than about 0.5 V, greater than about 1 V or greater than about 3V. In some embodiments, the threshold voltage of a transistor may be precisely controlled by controlling the thickness of the dielectric layer and/or the amount of exposure to negatively charged ions, as discussed below. The negatively charged ions may be any suitable ions including fluorine, oxygen, hydrogen, nitrogen, chlorine, bromine or sulfur, for example.

Several exemplary transistor structures in which negatively charged ions have been introduced into the gate dielectric and methods of fabrication are described below.

Figure 2:
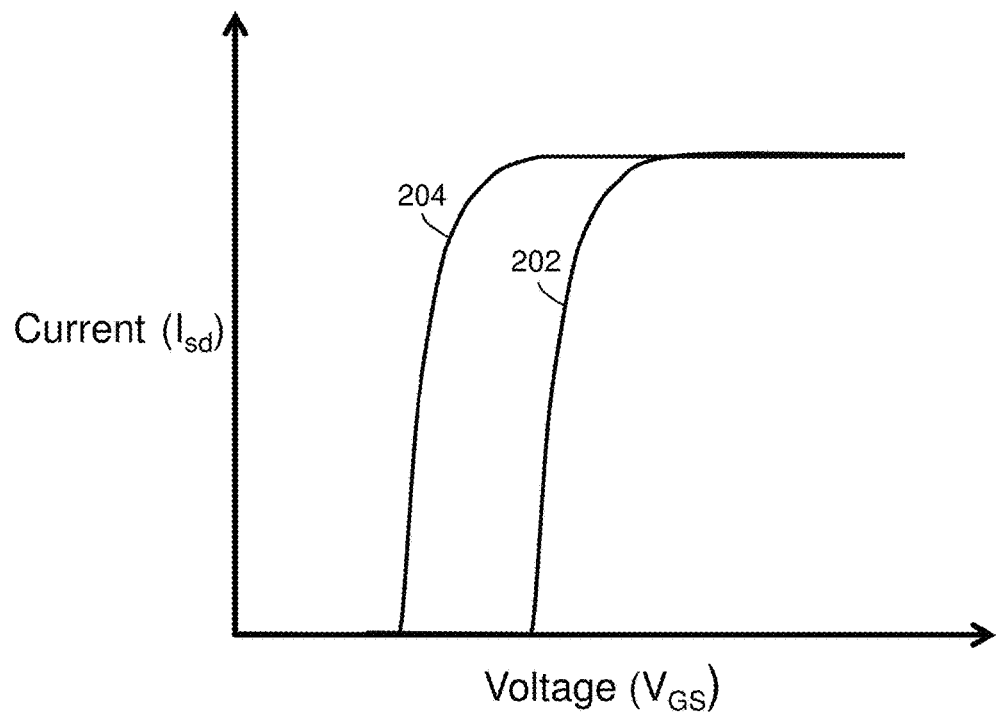
FIG. 2 illustrates the relationship between current and gate-source voltage for two devices with different threshold voltages.

FIG. 1 shows a cross-section of a field effect transistor 100 having a source 102, a gate 104, a drain 106, a gate dielectric layer 108 and a semiconductor region 110. Depending on the voltage (e.g., a gate-source voltage $V_{gs}$) applied to the gate 104, a channel is formed in the semiconductor region 110 and current flows through the channel between the source 102 and the drain 106. The current that flows between the source 102 and the drain 106 is termed the source-drain current $I_{sd}$. When the gate-source voltage $V_{gs}$ is increased above the threshold voltage ($V_{th}$) the source-drain current $I_{sd}$ increases significantly. Examples of the relationship between gate-source voltage and source-drain current are shown in FIG. 2 by curves 202 and 204. Curve 202 represents the current-voltage characteristics of a transistor with a relatively high threshold voltage, and curve 204 represents the current-voltage characteristics of a transistor with a lower threshold voltage. Transistors with a threshold voltage greater than zero may be considered normally-off (enhancement mode) transistors. Transistors with a threshold voltage equal to or less than zero may be considered to be normally on (depletion mode) transistors.

As discussed above, the presence of gate dielectric layer 108 may influence the threshold voltage, as the gate dielectric layer 108 may include positive charges that reduce the threshold voltage. According to the innovative techniques described herein, an increase in the threshold voltage and/or an improvement in the threshold voltage control of field effect transistors can be achieved by introducing negatively charged ions (anions) into the gate dielectric layer. Exemplary transistor structures having negatively charged ions introduced into the gate dielectric layer will be described with respect to FIGS. 3A-3F and 4A-4F.

Figure 3A:
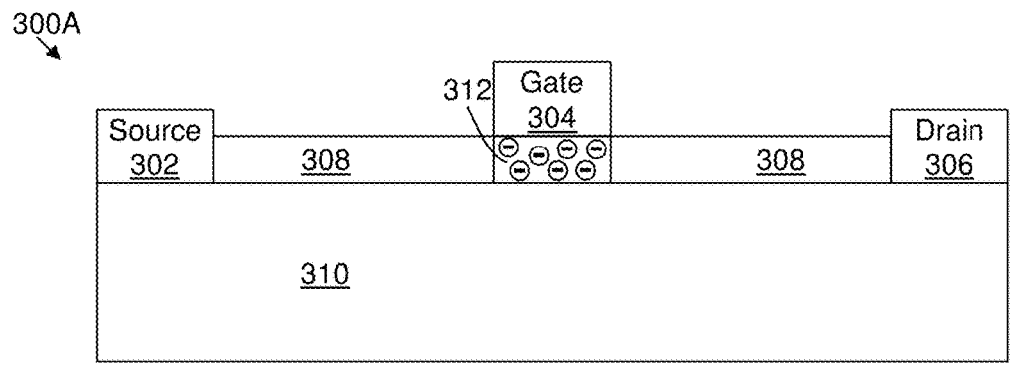
FIGS. 3A, 3B, 3C, 3D and 3F show exemplary semiconductor devices with negative ions in the dielectric layer under the gate.
Figure 3B:
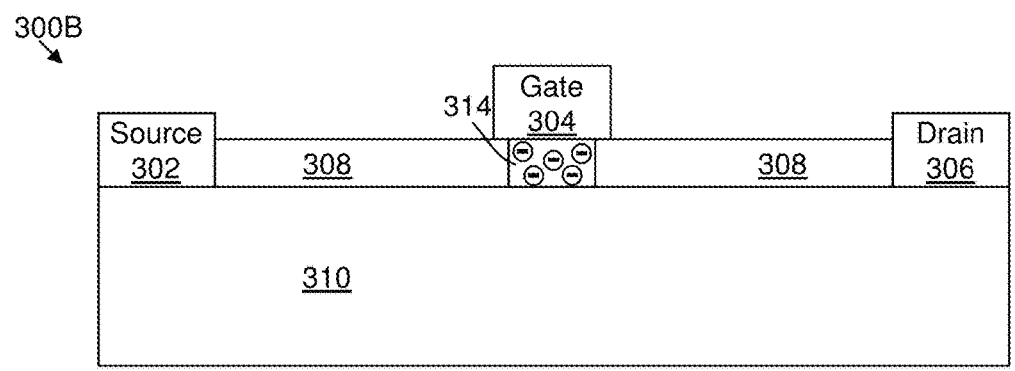
Figure 3C:
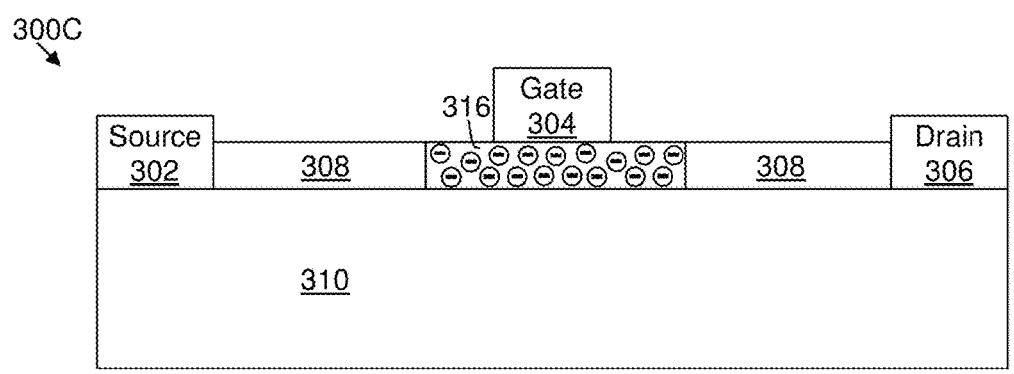
Figure 3D:
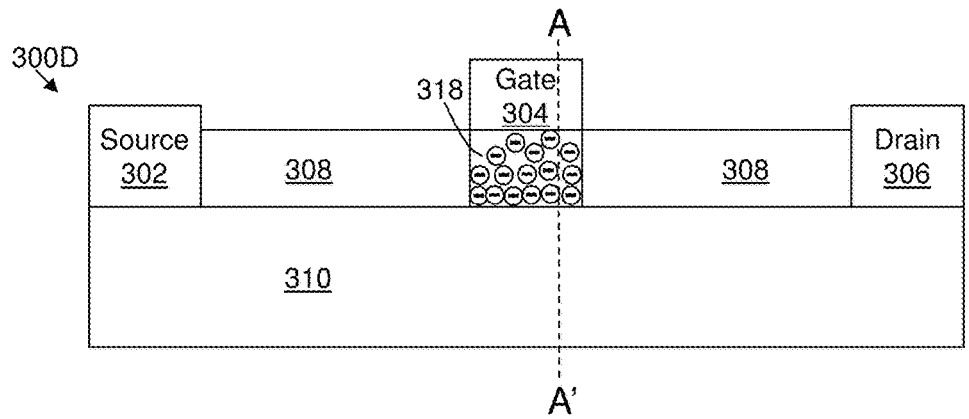
Figure 3E:
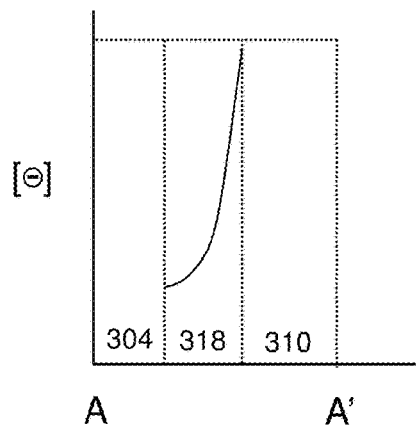
FIG. 3E shows a plot of the concentration profile of chemical species introduces as negative ions in the device shown in FIG. 3D.
Figure 3F:
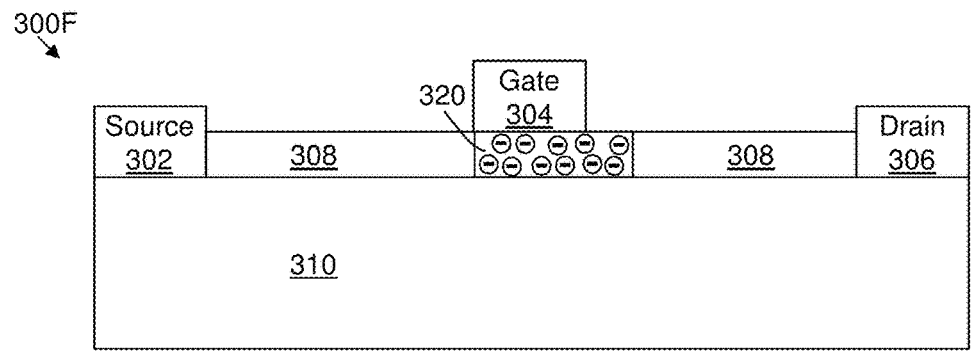

FIGS. 3A-3D show field effect transistors 300A, 300B, 300C, and 300D having negatively charged ions located in the gate dielectric layer 308 between gate 304 and semiconductor region 310. Field effect transistor 300A has a source 302, a gate 304, a drain 306, a gate dielectric layer 308, and a semiconductor region 310, as shown in FIG. 3A. In field effect transistor 300A, a region 312 of the gate dielectric layer includes negatively charged ions. Region 312 is under the gate 304 and has an area defined by the dimensions of the gate 304. Field effect transistor 300B has a gate dielectric layer 308 with negatively charged ions in a region 314 under a portion of the gate 304, as shown in FIG. 3B. Field effect transistor 300C has negatively charged ions in a region 316 of the gate dielectric layer 308 that extends beyond the edges of the gate 304, as shown in FIG. 3C. The negatively charged ions may be present in a portion of the gate dielectric layer 308 or may be present throughout the entire gate dielectric layer 308. In some embodiments the negatively charged ions may extend beyond the edges of the gate only on one side of the gate. For example, the negatively charged ions may be present in the dielectric layer under the gate as well as in at least a portion of the drain access region, but absent from the source access region, as in field effect transistor 300F as shown in FIG. 3F. The concentration of negatively charged ions in the drain access region may be the same or different from the concentration of the negatively charged ions under the gate.

The concentration of the negatively charged ions or the chemical species introduced as negatively charged ions within the gate dielectric layer 308 may be distributed in any suitable way. It should be noted that the negatively-charged ions may capture electrons or bond with the surrounding material. In some embodiments, the concentration of negatively charged ions or the chemical species introduced as negatively charged ions may be uniform throughout the thickness of the gate dielectric layer 308. In some embodiments, the concentration of negatively charged ions or the chemical species introduced as negatively charged ions may vary within the gate dielectric layer 308 so there is a higher concentration of closer to the semiconductor region 310 than near the gate 304. For example, within the gate dielectric layer 308 of field effect transistor 300D, region 318 has a higher concentration of negatively charged ions near the semiconductor region 310 than near the gate 304. FIG. 3E shows an exemplary concentration profile of the negatively charged ions or the chemical species introduced as negatively charged ions along line A-A' for transistor 300D. In this example, in region 318 the concentration is lowest at the gate-dielectric interface and highest at the semiconductor-dielectric interface.

In some embodiments, transistors 300A, 300B, 300C, and/or 300D may have a positive threshold voltage. In such embodiments, transistors 300A, 300B, 300C, and/or 300D may operate as enhancement mode (E-mode) devices.

Figure 4A:
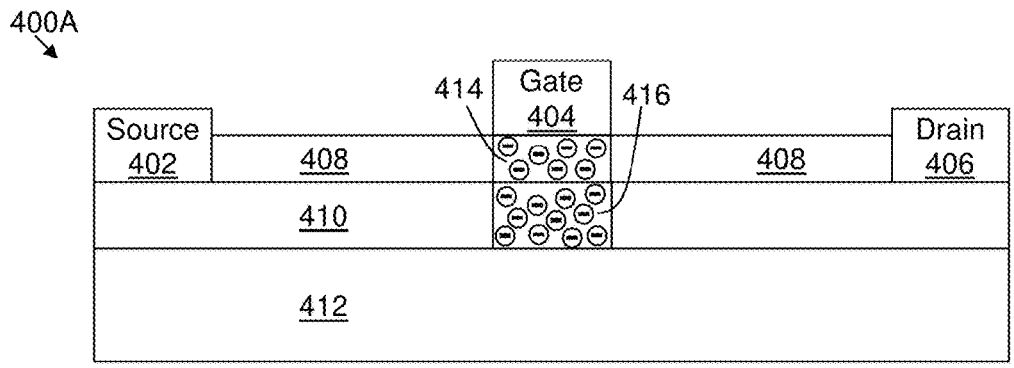
FIGS. 4A, 4B, 4C, 4D and 4F show exemplary semiconductor devices with negative ions in the dielectric layer and the semiconductor region under the gate.
Figure 4B:
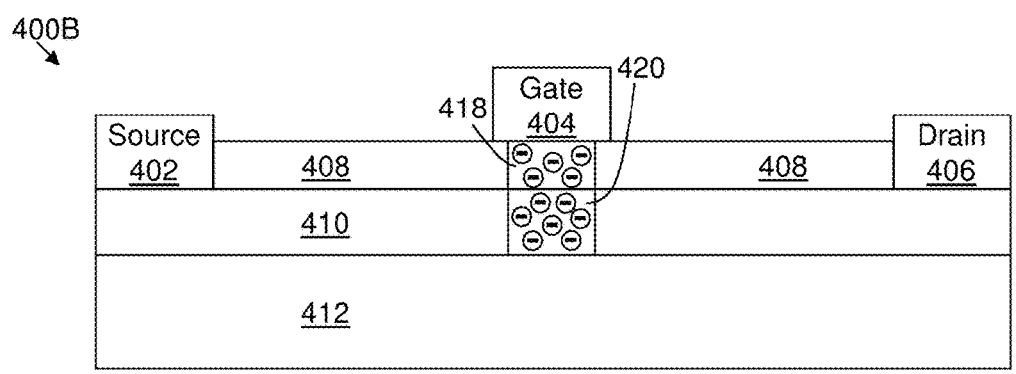
Figure 4C:
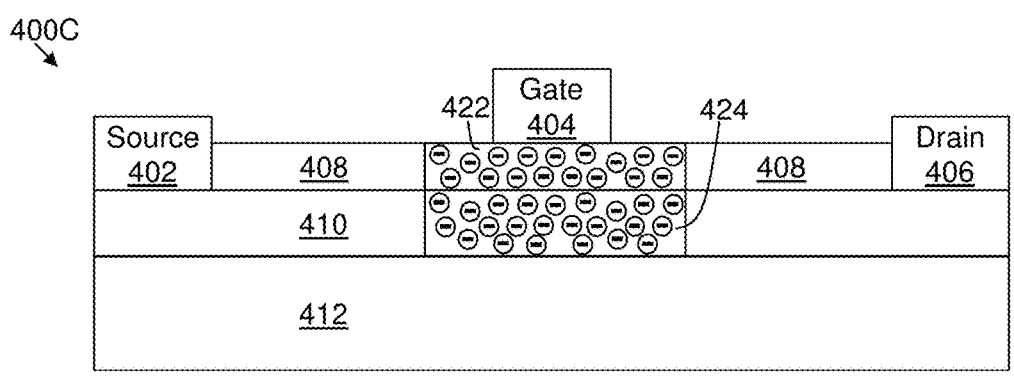
Figure 4D:
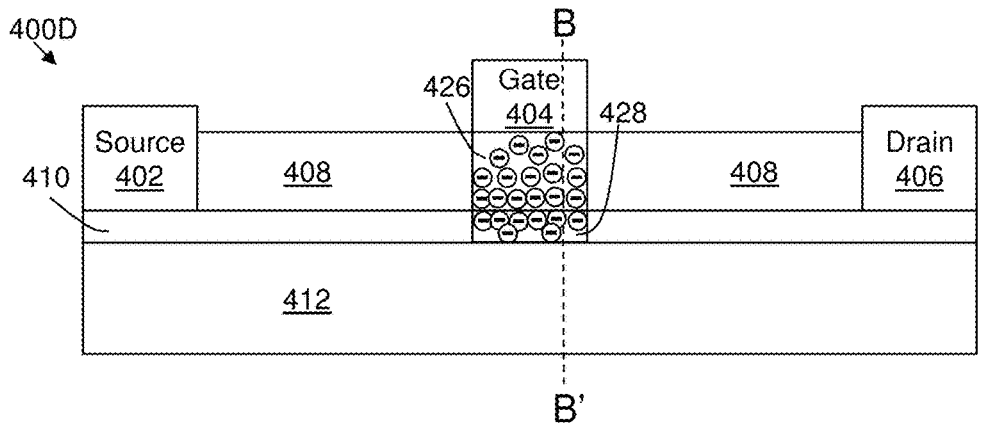
Figure 4E:
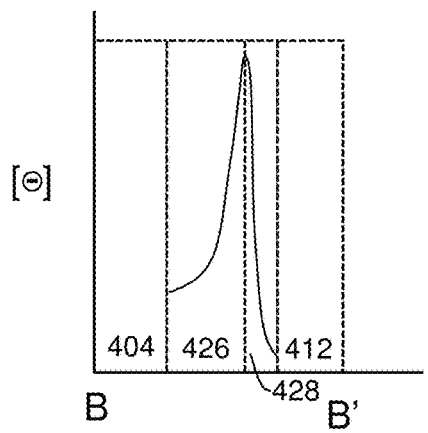
FIG. 4E shows a plot of the concentration profile of chemical species introduced as negative ions in the device shown in FIG. 4D.
Figure 4F:
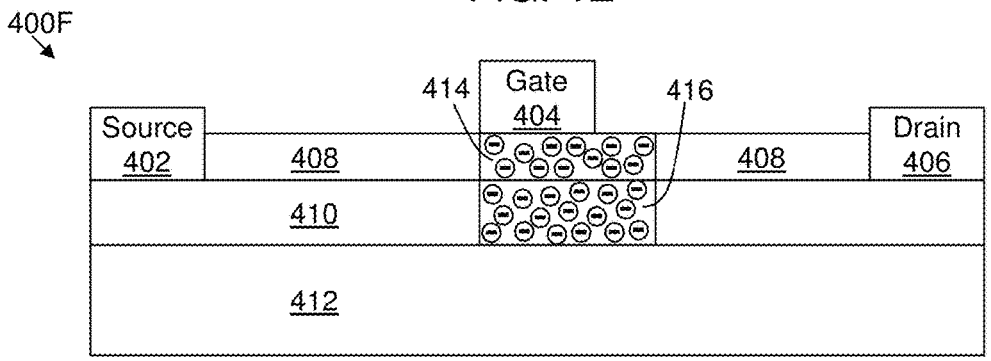

As illustrated in FIGS. 4A-4F, in some embodiments negatively charged ions may be introduced into both the gate dielectric layer 408 and the semiconductor region 410. Field effect transistor 400A has a source 402, a gate 404, a drain 406, a gate dielectric layer 408, and semiconductor regions 410 and 412, as shown in FIG. 4A. Negatively charged ions are located in a region 414 of the gate dielectric layer 408 and a region 416 of the semiconductor region 410. Regions 414 and 416 are located underneath the gate 404 and are defined by the dimensions of the gate. Field effect transistor 400B has a gate dielectric layer 408 where there are negatively charged ions in a region 418 of the gate dielectric layer 408 and a region 420 of semiconductor region 410 under a portion of the gate, as shown in FIG. 4B. Field effect transistor 400C has negatively charged ions that extend beyond the edges of the gate in region 422 of the gate dielectric layer 408 and in a region 424 of the semiconductor region 410, as shown in FIG. 4C. In some embodiments, the negatively charged ions may be arranged throughout the entire dielectric region 408 and/or semiconductor region 410 and/or in other layers. In some embodiments the negatively charged ions may extend beyond the edges of the gate only on one side of the gate. For example, the negatively charged ions may be present in the dielectric layer and semiconductor region under the gate as well as in at least a portion of the drain access region, but absent from the source access region, as in field effect transistor 400F as shown in FIG. 4F. The concentration of negatively charged ions in the drain access region may be the same or different from the concentration of the negatively charged ions under the gate.

The concentration of the negatively charged ions or the chemical species introduced as negatively charged ions within the gate dielectric layer 408 and the semiconductor region 410 may be distributed in any suitable way. The concentration may vary within the semiconductor region 410 so there is a higher concentration closer to the dielectric layer 408 than near semiconductor region 412. As discussed above, within the gate dielectric layer 408 of field effect transistor 400D, region 426 has a higher concentration near semiconductor region 410 than near the gate 404. FIG. 4E shows an exemplary concentration profile of the negatively charged ions or the chemical species introduced as negatively charged ions along line B-B' for transistor 400D. Within region 426 of the gate dielectric layer the concentration is lowest at the gate-dielectric interface and highest at the semiconductor-dielectric interface. Within region 428 of the semiconductor region 410, the concentration is highest at the dielectric-semiconductor interface and lowest at the interface between the two semiconductor regions 428 and 412.

In some embodiments, transistors 400A, 400B, 400C, and/or 400D may have a positive threshold voltage. In such embodiments, transistors 400A, 400B, 400C, and/or 400D may operate as normally off or enhancement-mode (E-mode) devices.

In some embodiments, semiconductor region 410 and semiconductor region 412 may have different bandgap energies, thereby forming a heterostructure. Semiconductor region 410 may have a larger bandgap than semiconductor region 412. In such embodiments, semiconductor region 410 may be termed a "bather layer." Semiconductor region 412 may be a buffer layer of graded composition or a region of uniform composition. In some embodiments, the field effect transistors shown in FIGS. 3 and 4 may be a metal-oxide-semiconductor high electron mobility transistor (MOS-HEMT) in which a two-dimensional electron gas (2DEG) channel is formed at the interface between the buffer layer and the barrier layer. However, the techniques described herein are not limited to MOS-HEMTs, as they may be applied to other types of semiconductor devices.

Any suitable materials may be used for forming the field effect transistors.

Any suitable materials may be used for the source and drain regions 302, 402, 306, 406, such as metal(s) and/or doped semiconductor. The source and drain regions 302, 402, 306, 406 may have ohmic contacts. In some embodiments, the source regions 302, 402 and/or drain regions 306, 406 may be formed on the semiconductor regions 310, 410. In some embodiments, the source regions 302, 402 and drain regions 306, 406 may be recessed in the semiconductor regions 310, 410 by removing a portion of the semiconductor regions 310, 410 at the source and drain regions and filling the cavity with the materials used for the source and drain regions.

Gates 304, 404 to control the transistor may be formed on gate dielectric regions 308, 408. Gates 304, 404 may be formed of any suitable conductor, such as a metal or doped semiconductor (e.g., polysilicon). The gate dielectric regions 308 and/or 408 may be formed of any suitable dielectric or insulating material, such as $Al_2O_3$, $SiO_2$, $HfO_2$, $Si_xO_yN_z$, $Si_xH_wO_yN_z$, or $Si_xN_y$, for example. The dielectric region may include more than one dielectric material. In some embodiments, the dielectric region may include a single dielectric layer or a plurality of sub-layers. In some embodiments, each sub-layer may be formed of a different dielectric material. In some embodiments, the material of the gate dielectric layer may be selected such that the quality of the gate dielectric material is not deteriorated by incorporating negatively charged ions. However, the techniques described herein are not limited as to the materials of the source, gate, drain, and/or dielectric regions.

The semiconductor regions 310, 410, 412 may be formed of any suitable semiconductor material(s). The semiconductor regions 310, 410, 412 may include a compound semiconductor material, such as III-V semiconductor material (e.g., a III-N material). In some embodiments, a nitride semiconductor based transistor may be formed in which semiconductor regions 310, 410, 412 include a nitride semiconductor material. In some embodiments, a nitride semiconductor material may be used such as $B_wAl_xIn_yGa_zN$, for example, in which w, x, y and z each have any suitable value between zero and one (inclusive), and w+x+y+z=1. Examples of nitride semiconductor materials include GaN, AlN, AlGaN, InAlN, InAlGaN, and InGaN, by way of example and not limitation. In some embodiments, the semiconductor regions 310, 410, 412 may include a gallium nitride (GaN) semiconductor material. However, the techniques herein are not limited to nitride semiconductor materials being included in semiconductor regions 310, 410, 412, as other semiconductor materials may be used.

The semiconductor regions 310, 410, 412 may be monocrystalline, and may have any suitable orientation. Compound semiconductor materials of semiconductor regions 310, 410, 412, may have any suitable composition at the face of the semiconductor material. If a III-N material is included, it may have an N-face composition, a group III face composition or a non-polar orientation. For example, GaN may be grown either N-face and Ga-face or in non-polar orientations.

The semiconductor regions 310, 410, 412 may be comprised of one or more materials, depending on the type of semiconductor device to be formed. Each semiconductor region may include one layer of a single material or more than one layer of different materials. As discussed above, in some embodiments, the semiconductor region may include a heterostructure having a plurality of layers of different semiconductor materials. In some embodiments, the plurality of layers may be materials with different bandgaps and/or polarizations, such as nitride semiconductor materials having different compositions, e.g., $B_{w1}Al_{x1}In_{y1}Ga_{z1}N$ and $B_{w2}Al_{x2}In_{y2}Ga_{z2}N$ materials.

The reference herein to $B_wAl_xIn_yGa_zN$ or a "$B_wAl_xIn_yGa_zN$ material" refers to a semiconductor material having nitride and one or more of boron, aluminum, indium and gallium. Examples of $B_wAl_xIn_yGa_zN$ materials include GaN, AlN, AlGaN, AlInGaN, InGaN, and BAlInGaN, by way of illustration. A $B_wAl_xIn_yGa_zN$ material may include other materials besides nitride, boron, aluminum, indium and/or gallium. For example, a $B_wAl_xIn_yGa_zN$ material may be doped with a suitable dopant (e.g., silicon, germanium, etc.). The term "gallium nitride (GaN) semiconductor material" refers to a semiconductor material that includes gallium and nitrogen and does not exclude other elements of a III-N semiconductor from being present, such as boron, aluminum, and/or indium, for example, and does not exclude the presence of dopants.

The semiconductor regions 310, 410, 412 may be doped or undoped. If the semiconductor regions 310, 410, 412 include a region that is doped, it may be polarization doped or may include dopants such as n-type dopants or p-type dopants, and may have any suitable doping concentration and distribution. Any suitable doping technique may be used, such as implantation or diffusion, for example.

As discussed above, the negatively charged ions may be any suitable ions including fluorine, oxygen, hydrogen, nitrogen, chlorine, bromine, and/or sulfur. Such negatively charged ions may include $F^-$, $O^{2-}$, $H^-$, $N^{3-}$, $Cl^-$, $Br^-$, and/or $S^{2-}$. In some embodiments the negatively charged ions may include more complex species such as $CHF_3$ and/or $CHF_4$. The negatively charged ions may contain chemical elements with a high electronegativity. In some embodiments, a chemical species introduced as a negative ion may be highly electronegative. In some embodiments the electronegativity value of an chemical element in the introduced chemical species may be greater than 3.8, greater than 3.4, greater than 3.0, greater than 2.8, greater than 2.5, or greater than 2.0. Any suitable techniques for introducing the ions into the dielectric region and/or semiconductor region may be used. Such techniques may include plasma treatment, chemical surface treatment followed by diffusion annealing, ion implantation, and plasma-enhanced or plasma-assisted ion implantation. Such plasma treatment may be performed in an etching system for example. Gases may be used as part of plasma treatment to incorporate negatively charged ions into a device. As an example, when fluorine ions are introduced into a device, gases such as $CF_4$, $SF_6$, and $CHF_3$ may be used. As discussed below, negatively charged ions may be introduced in the device before the dielectric layer is formed, during formation of the dielectric layer, or after the dielectric layer has been formed.

The threshold voltage may be modulated by changing the amount and distribution of negatively charged ions incorporated into the device. A duration of time for which negatively charged ions are introduced to a device may determine the number of negatively charged ions present in the device. By changing the duration of time, the number of negatively charged ions can be altered and the threshold voltage can be modulated. Such a duration of time may be the amount of time the device is incorporating negatively charged ions, such as a plasma treatment time. In embodiments where negatively charged ions are incorporated into a barrier layer of a device, the negatively charged ions may effectively deplete electrons in the channel and may enable a positive value for the threshold voltage. Additionally or alternatively, the threshold voltage may be modulated by changing the thickness of the dielectric layer. The thickness of the dielectric layer can influence the threshold voltage by changing gate capacitance and the gate-to-channel spacing. The thickness of the dielectric layer may change the quantity and distribution of negatively charged ions in the dielectric layer which may influence the threshold voltage. In some embodiments, increasing the thickness of the dielectric layer may increase the threshold voltage.

FIGS. 5A-5E show a method of forming a field effect transistor with negatively charged ions under the gate, according to some embodiments.

Figure 5A:
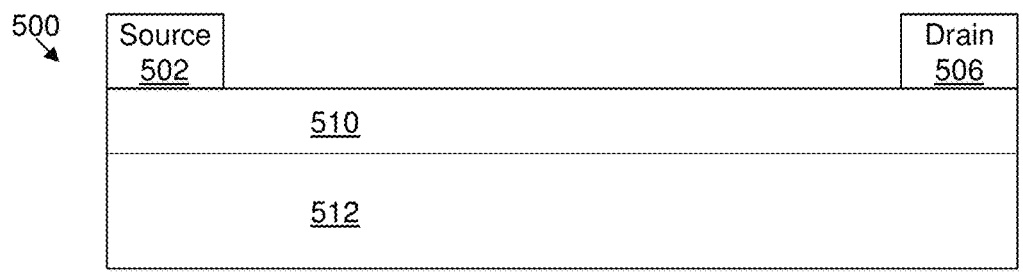
FIGS. 5A-E show an example of a process for forming a semiconductor device with negative ions in the dielectric and semiconductor regions, according to some embodiments.

As shown in FIG. 5A, semiconductor region 510 may be formed over semiconductor region 512. Region 510 and region 512 may form a heterostructure in which region 510 is formed of a material with a larger bandgap than region 512. Source region 502 and drain region 506 may be formed on/in semiconductor region 510.

Figure 5B:
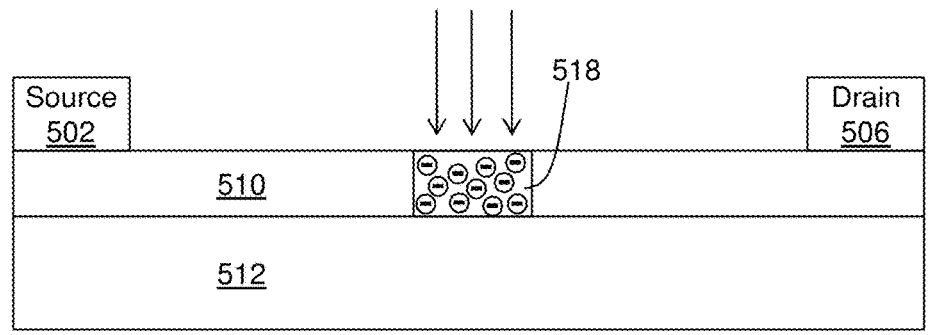
Figure 5C:
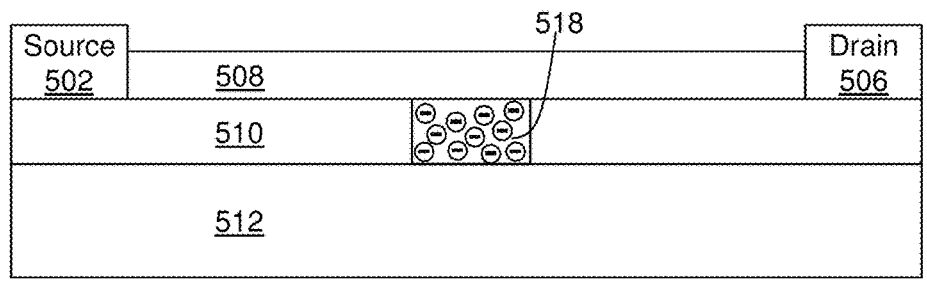
Figure 5D:
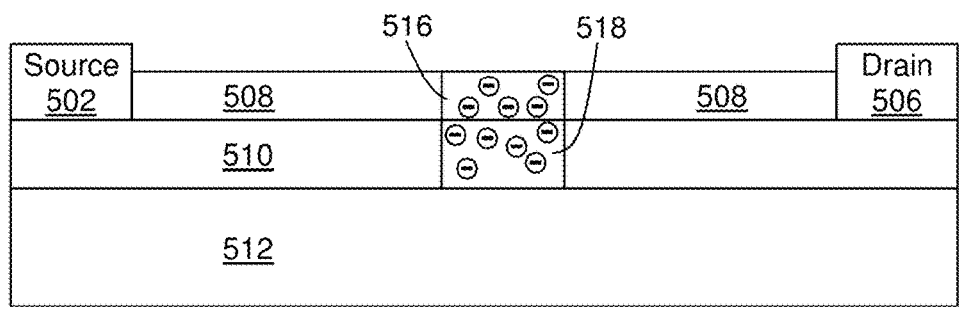
Figure 5E:
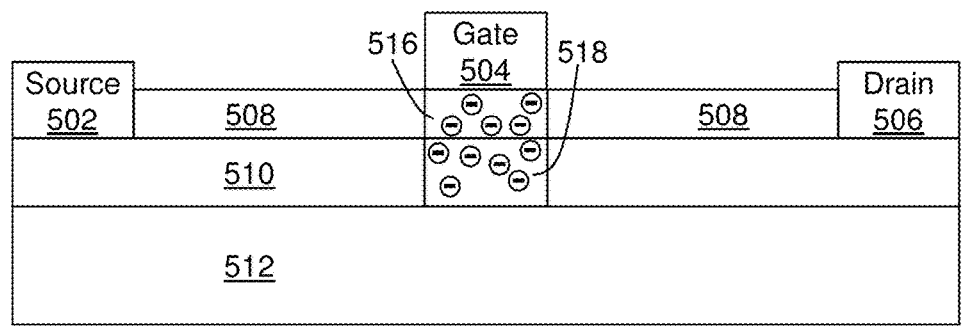

As shown in FIG. 5B, negatively charged ions may be introduced into a region 518 of semiconductor region 510. Negatively charged ions may be introduced by any suitable process, such as plasma treatment, ion implantation, and/or plasma-enhanced ion implantation, for example. A dielectric layer 508 may be formed on the semiconductor region 510 as is shown in FIG. 5C. Any suitable technique may be used for forming the gate dielectric layer, such as atomic layer deposition (ALD), low pressure chemical vapor deposition (LPCVD) or plasma enhanced chemical vapor deposition (PECVD), for example. While the dielectric layer is formed, a high temperature may be reached which may cause diffusion of the negatively charged ions into the dielectric layer. As an example, if ALD is used it may be performed at an elevated temperature of 250° C. During or subsequent to formation of the gate dielectric layer, the device may be heated such that that the negatively charged ions may diffuse from the semiconductor region 518 to a region 516 of the dielectric layer 508, as shown in FIG. 5D. Heating the device may improve diffusion of the negatively charged ions from semiconductor region 510 to dielectric region 516. As shown in FIG. 5E, a gate 504 may be formed on the region 516 of the dielectric layer where negatively charged ions are located. Although the gate 504 shown in FIG. 5E is positioned to align with the region of negatively charged ions 516 in dielectric layer 508, the gate may be arranged in any suitable way with respect to region 516, as shown in FIGS. 4A-4F. In some embodiments, the gate may be formed over the dielectric layer before the negatively charged ions diffuse into the dielectric layer from the semiconductor region. In such embodiments, a thermal annealing step may be performed on the entire device after the gate is formed. During this step the device may reach an elevated temperature (at least 400° C., in some cases), and negatively charged ions may diffuse into the dielectric layer.

FIGS. 6A-6F show a method of forming a field effect transistor with negatively charged ions under the gate, according to some embodiments in which a protection layer is used.

Figure 6A:
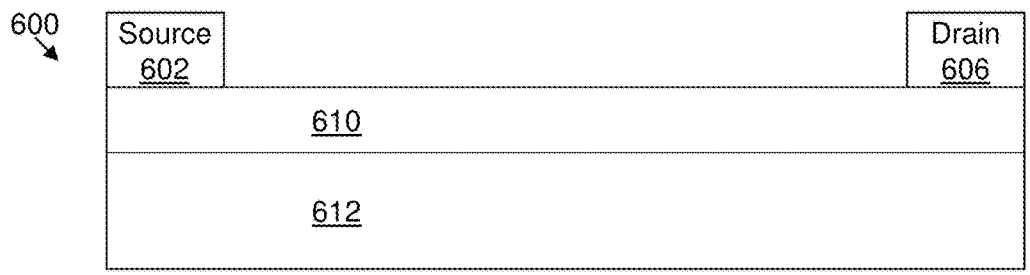
FIGS. 6A-F show an example of a process for forming the semiconductor device with negative ions in the dielectric and semiconductor regions that includes forming a protection layer over the semiconductor region, according to some embodiments.
Figure 6B:
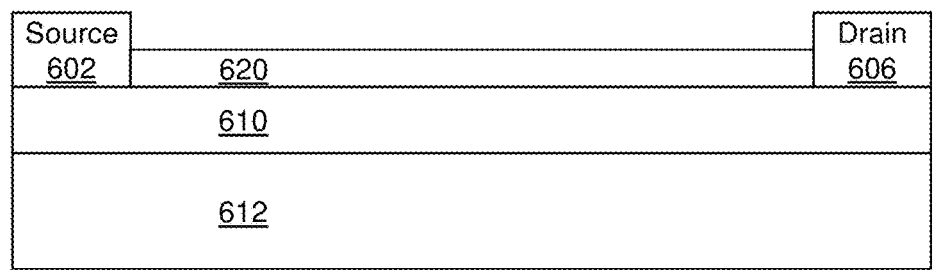

As shown in FIG. 6A, semiconductor region 610 may be formed over semiconductor region 612. Source region 602 and drain region 606 may be formed on/in semiconductor region 610. A protection layer 620 may be formed on semiconductor region 610 as shown in FIG. 6B. The protection layer 620 may be grown or deposited on the semiconductor region. The protection layer may reduce damage and/or etching to the semiconductor region during the introduction of negatively charged ions. Any suitable material may be used as a protection layer, such as dielectrics, polymer, and metal. Exemplary dielectric materials that may be used for a protection layer include $SiO_2$, $Al_2O_3$, $HfO_2$, and $SiN_x$.

Figure 6C:
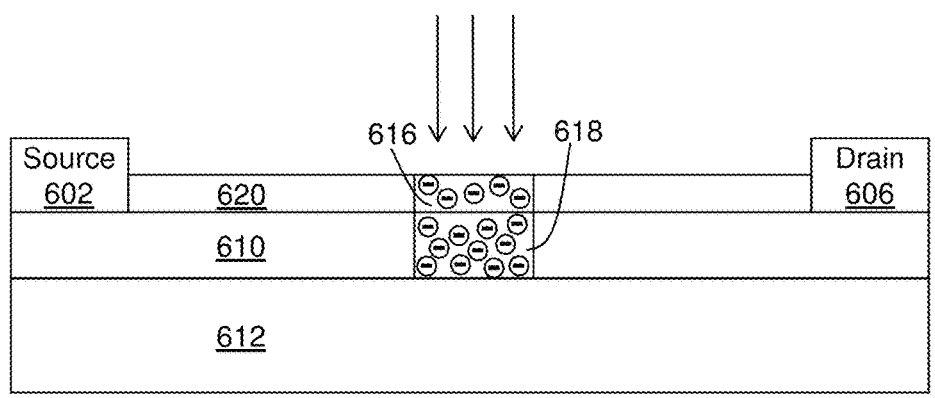
Figure 6D:
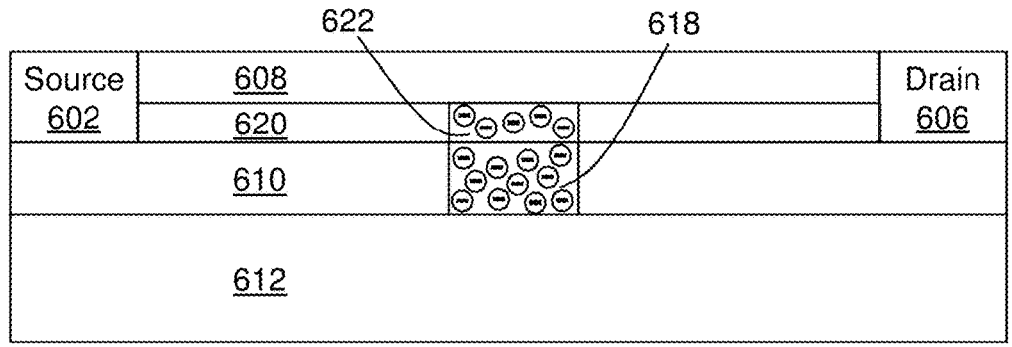
Figure 6E:
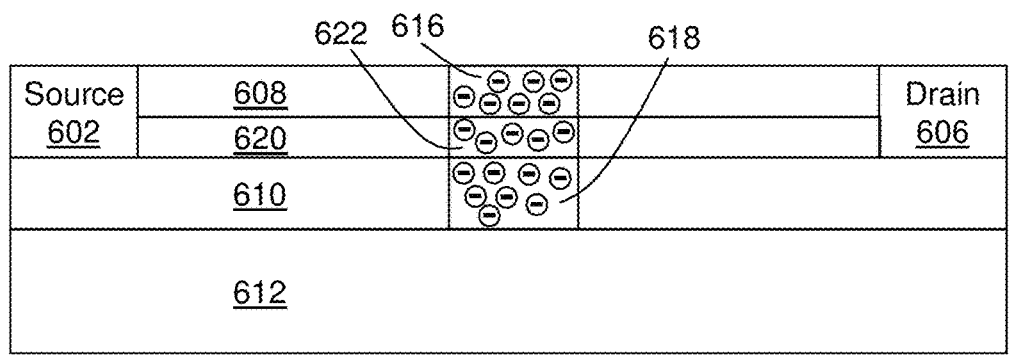
Figure 6F:
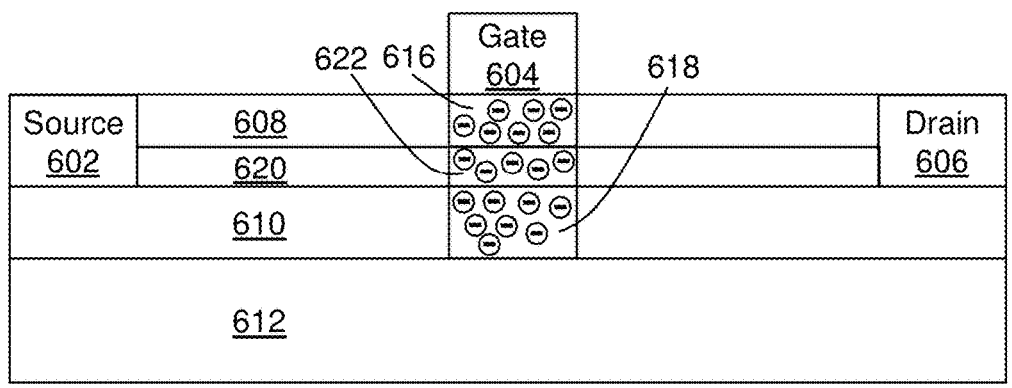

As shown in FIG. 6C, negatively charged ions may be introduced into protection layer region 616 and semiconductor region 618. Any suitable techniques may be used for introducing negatively charged into regions 616 and 618. A dielectric region 608 may be deposited on the protection layer 620 as is shown in FIG. 6D. The dielectric layer may be formed by deposition techniques, such as atomic layer deposition (ALD). In some embodiments, the protection layer 620 may be removed before a dielectric region is formed. Diffusion of the negatively charged ions from the semiconductor region 618 and/or protection layer 620 to a region 616 of the dielectric layer may be initiated by heating the device. Increasing the temperature of the device may increase diffusion of the negatively charged ions to dielectric region 616. Regardless of the techniques used, negatively charged ions may be located in semiconductor region 618, protection layer region 622, and/or dielectric region 616. As shown in FIG. 6F, a gate is formed on the region of the dielectric 616 where negatively charged ions are located. In some embodiments, the gate may be formed over the dielectric layer before the negatively charged ions move into the dielectric layer from the semiconductor region. In such embodiments, a thermal annealing step may be performed on the entire device after the gate is formed. During this step the device may reach a high temperature and negatively charged ions may diffuse into the dielectric layer.

FIGS. 7A-7D show a method of forming a field effect transistor with negatively charged ions under the gate, according to some embodiments in which negatively charged ions are introduced into the gate dielectric layer while the gate dielectric layer is formed.

Figure 7A:
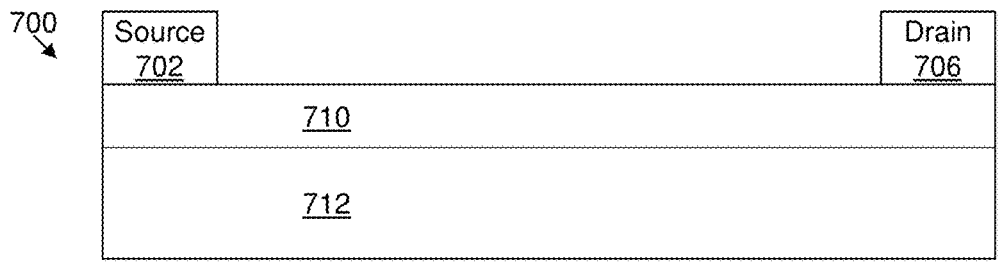
FIGS. 7A-D show an example of a process for forming the semiconductor device with negative ions in the dielectric region, according to some embodiments in which negatively charged ions are introduced into the gate dielectric layer while the gate dielectric layer is formed.
Figure 7B:
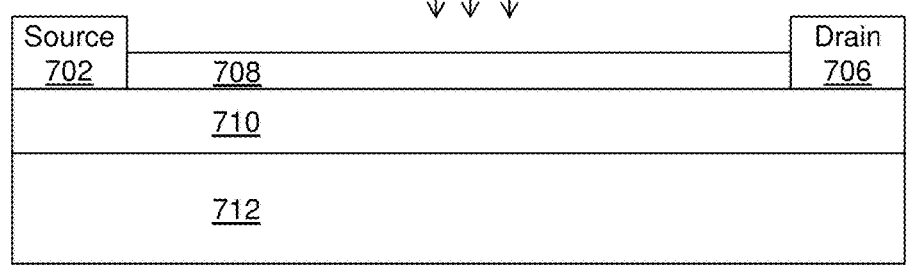
Figure 7C:
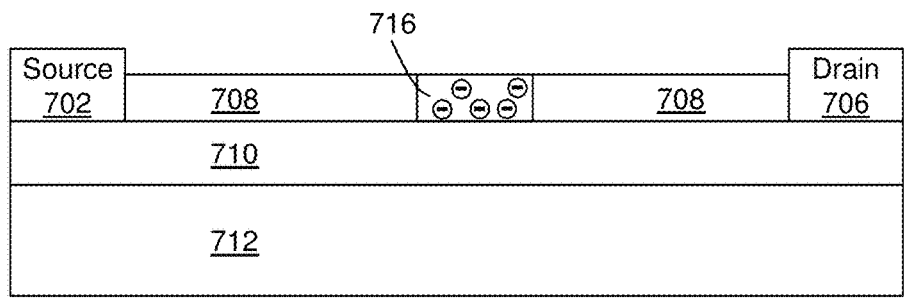
Figure 7D:
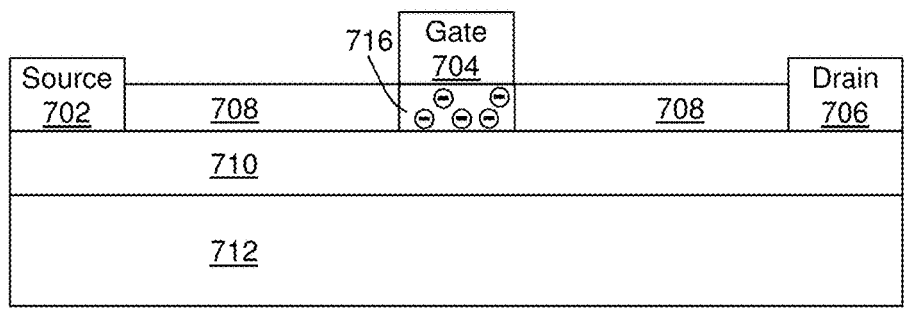

As shown in FIG. 7A, semiconductor region 710 may be formed over semiconductor region 712. Source region 702 and drain region 706 may be formed on/in semiconductor region 710. As a gate dielectric region 708 is formed on semiconductor region 710, negatively charged ions are introduced into the dielectric layer, as shown in FIG. 7B. In some embodiments, the dielectric layer may be formed by depositing multiple sub-layers, such as through ALD. During such a process, negatively charged ions may be incorporated into the sub-layers as the dielectric layer is deposited. When formation of the gate dielectric layer 708 is completed, negatively charged ions are located within region 716 of the gate dielectric layer as shown in FIG. 7C. As shown in FIG. 7D, a gate is formed on the region of the dielectric 716 where negatively charged ions are located.

FIGS. 8A-8D show a method of forming a field effect transistor with negatively charged ions under the gate, according to some embodiments in which negatively charged ions are introduced into the gate dielectric after the gate dielectric is formed.

Figure 8A:
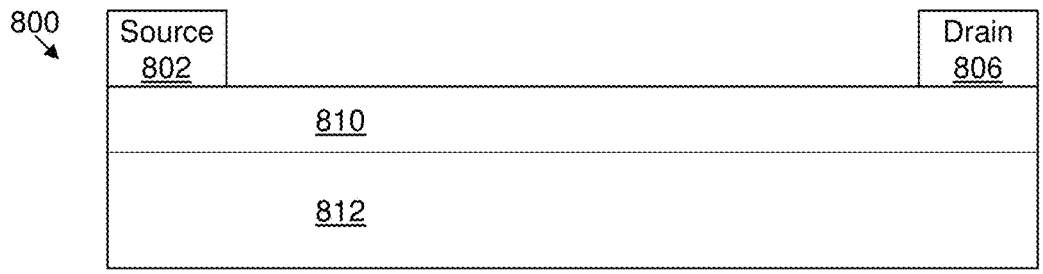
FIGS. 8A-D show an example of a process for forming a semiconductor device with negative ions in the dielectric region, according to some embodiments in which negatively charged ions are introduced into the gate dielectric after the gate dielectric is formed.
Figure 8B:
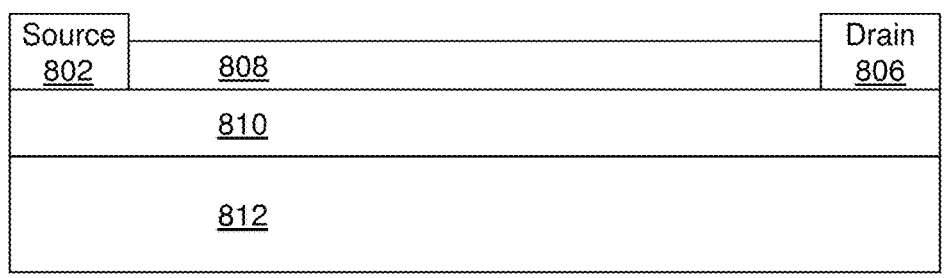
Figure 8C:
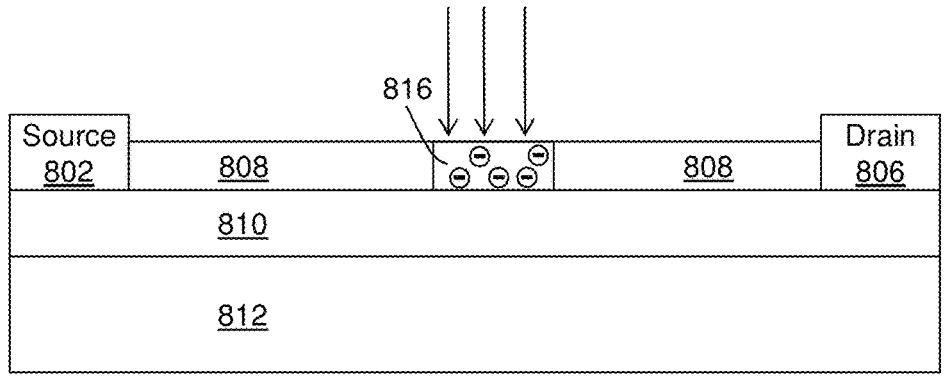
Figure 8D:
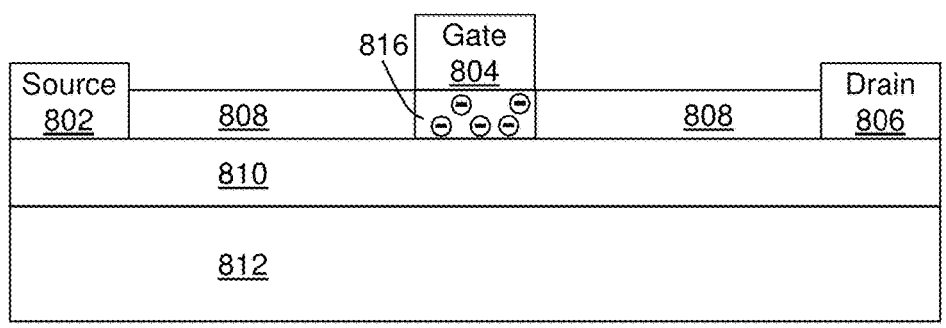

As shown in FIG. 8A, semiconductor region 810 may be formed over semiconductor region 812. Source region 802 and drain region 806 may be formed on/in semiconductor region 810. A gate dielectric layer 808 is formed on semiconductor region 810 as shown in FIG. 8B. Negatively charged ions may be introduced into the dielectric layer after the dielectric layer has formed. Such techniques as ion implantation or plasma-enhanced ion implantation may be used to incorporate negatively charged ions into region 816 of the gate dielectric layer 808, as shown by FIG. 8C. As shown in FIG. 8D, a gate is formed on the region of the dielectric 816 where negatively charged ions are located.

Although the above methods describe a gate positioned to align with the region of negatively charged ions in dielectric layer, the gate may be arranged in any suitable way with respect to the negatively charged ions, as shown in FIGS. 3A-3F.

Additional steps may be performed to improve device performance. In some embodiments, surface cleaning is performed before the dielectric layer is formed. Such surface cleaning may reduce the presence of interface states between the dielectric region and the semiconductor region. Additionally or alternatively, the device may be thermally annealed (e.g., using rapid thermal annealing) after deposition of the gate electrode. Such an annealing step may repair channel degradation and may also improve diffusion of the negatively charged ions.

The described techniques for incorporating negatively charged ions into a semiconductor device may be combined with other device structures to achieve a positive threshold voltage for a normally off device. Such structures may include gate structures such as, gate-recess, dual gate integration, tri-gate structure, gate injection, polarization engineering, gate metal engineering, or any other suitable techniques. In some embodiments, the gate region may have a sub-micron gate length that may reduce the on-resistance of the device.

In some embodiments negatively charged ions may reduce the effects of impurities or defects on the performance of the device. The negatively charged ions may passivate interface or surface states that may arise at the dielectric-semiconductor interface. The negatively charged ions may also passivate defects in the bulk of the semiconductor region or the dielectric region. The passivation of interface states and/or bulk defects may reduce trapping effects in the device. As a result, the performance of the device may be enhanced for certain operations of the device, such as pulse operation.

EXAMPLE

Figure 9:
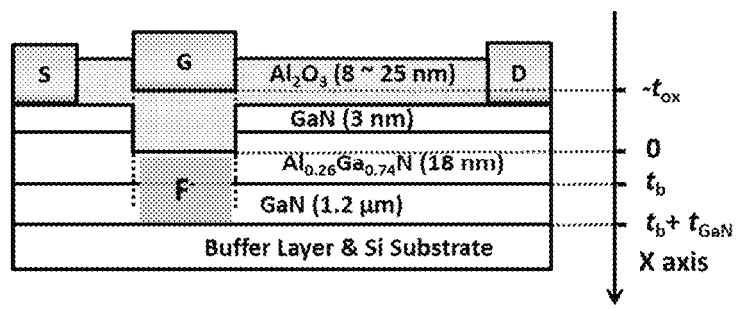
FIG. 9 illustrates an example transistor prototype with negatively charged fluorine ions in the dielectric layer under the gate.

An example of a prototype device of the transistor with negatively charged ions in the dielectric layer has been fabricated. The prototype device is a normally-off fluorinated GaN transistor. The prototype device was fabricated on an $Al_{0.26}Ga_{0.74}N/GaN$ structure grown on a Si substrate. After mesa isolation and ohmic contact formation, the gate region of three devices was treated by $CF_4$ plasma in an Electron Cyclotron Resonance (ECR) Reactive Ion Etching (RIE) system at an ECR power of 150 W and an RF power of 20 W for 150 s, 160 s and 170 s, respectively. A 3 nm GaN layer and a 10~11.5 nm $Al_{0.26}Ga_{0.72}N$ layer was etched by a 150~170 s $CF_4$ plasma. The thickness of the layers were measured by atomic force microscopy. A gate oxide of $Al_2O_3$ was deposited by atomic layer deposition (ALD) at 250° C. with different thicknesses. A gate electrode of Ni/Au was deposited before annealing at 400° C. for 5 min in $N_2$ ambient. The annealing may reduce potential channel damage and the high temperature may allow the fluorine ions to diffuse into the gate oxide. A schematic of the fabricated prototype device is shown in FIG. 9. As a reference, standard AlGaN/GaN MOS-HEMTs were fabricated on the same sample. The reference devices have the same gate dielectric stacks and process conditions.

Figure 10:
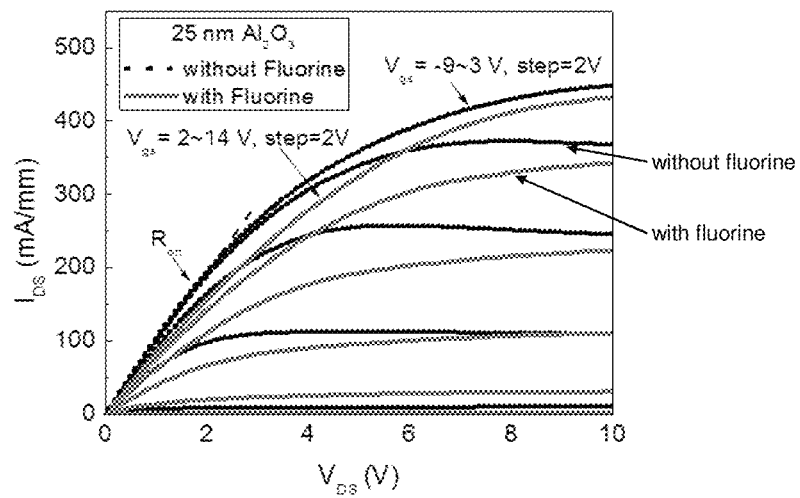
FIG. 10 is a plot of current versus voltage for non-fluorinated and fluorinated MOS-HEMTs with a 25 nm thick $Al_2O_3$ gate oxide.
Figure 11:
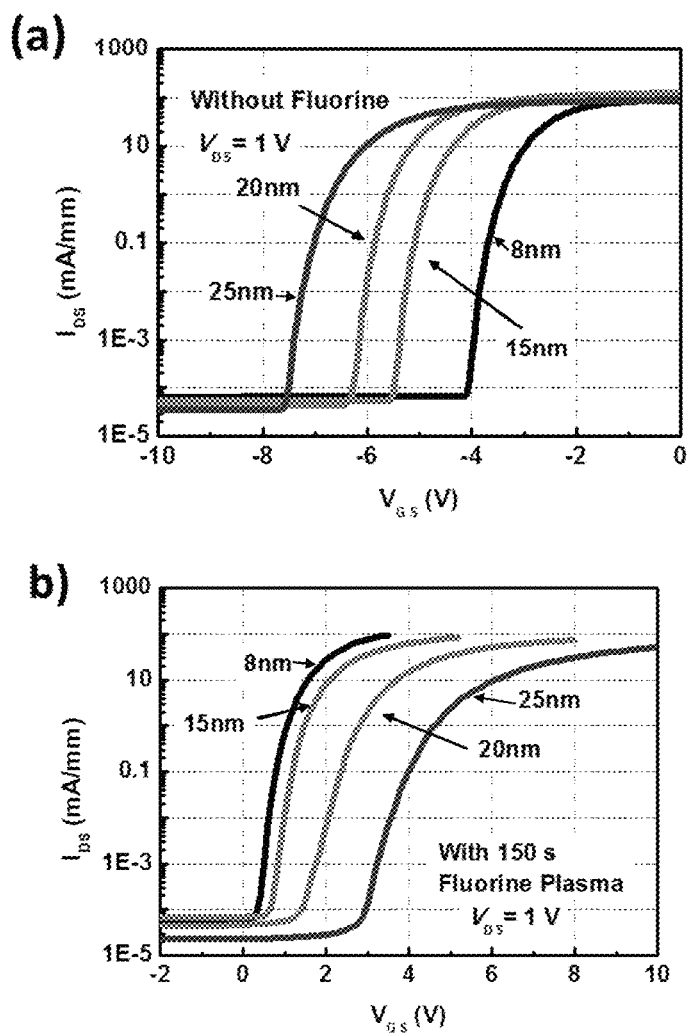
FIG. 11A-B are plots of current versus voltage for non-fluorinated and fluorinated MOS-HEMTs with different oxide thicknesses.
Figure 12:
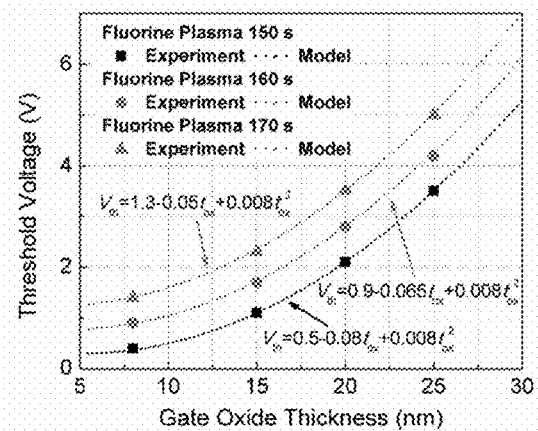
FIG. 12 is a plot of threshold voltage values versus gate oxide thicknesses for fluorinated MOS-HEMTs for different fluorine treatment times and comparisons to analytical models.

FIG. 10 shows the output characteristics of standard and fluorinated MOS-HEMTs with 25 nm gate oxide. As shown, the fluorine plasma treatment induces a small degradation in the on-resistance and maximum current. FIGS. 11A and 11B show the transfer characteristics of standard non-fluorinated and fluorinated MOS-HEMTs with different gate oxide thickness. As shown, a threshold voltage ($V_{th}$) higher than 3 V was achieved for MOS-HEMTs with 25 nm gate oxide. FIG. 12 shows the $V_{th}$ of MOS-HEMTs as a function of oxide thickness and fluorine treatment time. The $V_{th}$ has been demonstrated to increase with increasing gate oxide thickness. Increasing the time of the fluorine plasma treatment also increases the threshold voltage ($V_{th}$). The dashed lines in FIG. 12 show an analytical model for the threshold voltage of fluorinate MOS-HEMTs. This analytical model enables the accurate calculation and design of the $V_{th}$ of fluorinated MOS-HEMTs. The analytical model is briefly demonstrated as, $$V_{th} = \frac{\Phi_b}{q} - \frac{\Delta E_c}{q} - \frac{\Phi_f}{q} - \frac{qt_b}{\varepsilon_{AlGaN}} Q_{AlGaN/GaN} - \varphi(F) -$$
$$\frac{q}{\varepsilon_{ox}}[Q_{AlGaN/GaN} + Q_{Al_2O_3/AlGaN} + Q(F)]t_{ox} - \frac{q\overline{n_{ox}}}{2\varepsilon_{ox}}t_{ox}^2$$

where $\Phi_b$ is the metal barrier height for Ni on $Al_2O_3$, $\Delta E_c$ is the conduction band offset between $Al_2O_3$ and GaN, $\Phi_f$ is the energy difference between the conduction band intrinsic Fermi-level in GaN. t is the thickness, $\varepsilon$ is the permittivity, and the subscripts ox and b refer to the oxide ($Al_2O_3$) and barrier layer (AlGaN). $\overline{n_{ox}}$ is the average oxide bulk charge. $Q_{Al_2O_3/AlGaN}$ and $Q_{AlGaN/GaN}$ are the interface charge density at the $Al_2O_3$/AlGaN interface and the AlGaN/GaN-channel interface. Q(F) is defined as a fluorine equivalent interface charge calculated by integration of the fluorine negative charge in the bulk GaN and AlGaN; $\varphi(F)$ is defined as a fluoride-induced constant band shift.

Figure 13:
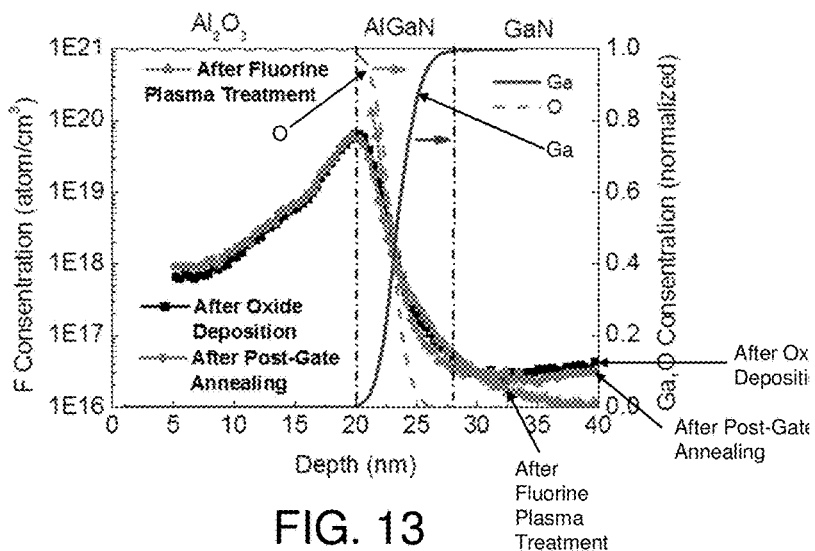
FIG. 13 is a plot of fluorine, gallium, and oxygen concentration versus depth under the gate of an exemplary transistor.

FIG. 13 shows the secondary secondary-ion mass spectrometry (SIMS) measurements of the F, Ga and O profile in the fluorinated MOS capacitors. The fluorine (F) profile shown in FIG. 13 indicates that the negatively charged ions in the gate oxide are due to fluorine ions moving into the gate oxide during the ALD process at 250° C. The post-gate annealing at 400° C. almost did not change the fluorine distribution in the structure. The analysis above demonstrates the significance of fluorine plasma treatment: it is the fluoride-induced negatively charged ions in AlGaN and $Al_2O_3$ that enables the $V_{th}$ to increase with gate oxide thickness. This provides a method to engineer the $V_{th}$ by changing the gate oxide thickness in E-mode MOS-HEMTs.

Figure 14:
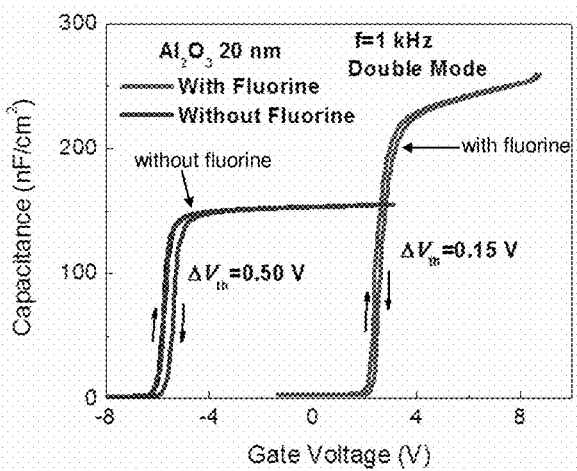
FIG. 14 is a plot of capacitance versus gate voltage for non-fluorinated and fluorinated MOS devices with a 20 nm gate oxide.

FIG. 14 shows the capacitance-voltage characteristics of standard and fluorinated MOS capacitors with 20 nm gate oxide. As shown, a smaller $V_{th}$ hysteresis (~0.15 V) was observed for fluorinated MOS capacitors compared with standard MOS capacitors (~0.5 V) in the capacitance-voltage measurements. This may be due to the fluorine passivation of oxide/AlGaN interface states and the fluoride-induced conduction bending that increases the barrier for electron trapping.

The effect of a protection layer during forming a semiconductor device may impact the device performance. A 10 nm thin $Al_2O_3$ layer was deposited on top of GaN cap layer before the fluorine plasma treatment into AlGaN/GaN structure. After the fluorine plasma treatment, gate electrodes were deposited and fluorinated HEMTs were fabricated. It was found that the thin protection layer could reduce the etching of AlGaN/GaN to achieve a normally-off device. In the process with protection layer, 150 s fluorine plasma was used to achieve the normally-off device, where 10 nm $Al_2O_3$, 3 nm GaN layer, and 1~2 nm AlGaN layer were etched. In comparison, in the process without protection layer, 120 s fluorine plasma is needed to achieve the normally-off, where 3 nm GaN cap layer and 7.5-9 nm AlGaN layer were etched. Moreover, in the comparison of device performance, the fluorinated HEMTs fabricated using a thin protection layer have smaller on-resistance and higher maximum current than the fluorinated HEMTs without using protection layer.

Additional Aspects

The techniques described herein may be applied to any type of field effect transistor. In some embodiments, the techniques described herein may be applied to power transistors. Such techniques can provide improvements in power transistors that will enable significant improvements in power electronics systems for hybrid vehicles, high efficiency power inverters for solar cells, and power converters for LEDs, for example, as well as high-speed digital electronics.

Various aspects of the present invention may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Also, the invention may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

What is claimed is:

1. A field effect transistor, comprising:
a source;
a drain;
a gate;
a semiconductor region under the gate; and
a dielectric region between the gate and the semiconductor region, wherein the dielectric region has a first surface on a first side of the dielectric region nearest the gate and a second surface on a second side of the dielectric region nearest the semiconductor region, wherein at least a portion of the dielectric region comprises negatively charged ions, wherein a concentration of the negatively charged ions in the at least a portion of the dielectric region continuously increases with proximity to the semiconductor region,
wherein the concentration of the negatively charged ions is higher at the second surface than at the first surface.

2. The field effect transistor of claim 1, wherein the semiconductor region comprises a nitride semiconductor material.

3. The field effect transistor of claim 2, wherein the nitride semiconductor material comprises a gallium nitride semiconductor material.

4. The field effect transistor of claim 1, wherein at least a portion of the semiconductor region comprises negatively charged ions.

5. The field effect transistor of claim 1, wherein the negatively charged ions comprise fluorine, oxygen, hydrogen, nitrogen, chlorine, bromine and/or sulfur.

6. The field effect transistor of claim 1, wherein the dielectric region comprises aluminum oxide, silicon oxide, silicon oxynitride, aluminum nitride, hafnium oxide, and/or silicon nitride.

7. The field effect transistor of claim 1, wherein the field effect transistor is an enhancement mode transistor.

8. The field effect transistor of claim 7, wherein the field effect transistor has a threshold voltage of at least 0.5 V.

9. The field effect transistor of claim 1, wherein the dielectric region comprises a single dielectric layer or a plurality of dielectric layers.

10. A field effect transistor, comprising:
a source;
a drain;
a gate;
a semiconductor region under the gate; and
a dielectric region between the gate and the semiconductor region, wherein the dielectric region has a first surface on a first side of the dielectric region nearest the gate and a second surface on a second side of the dielectric region nearest the semiconductor region, wherein at least a portion of the dielectric region comprises negatively charged ions, wherein a concentration of the negatively charged ions in the dielectric region is highest at the second surface.

11. The field effect transistor of claim 10, wherein the semiconductor region comprises a nitride semiconductor material.

12. The field effect transistor of claim 11, wherein the nitride semiconductor material comprises a gallium nitride semiconductor material.

13. The field effect transistor of claim 10, wherein at least a portion of the semiconductor region comprises negatively charged ions.

14. The field effect transistor of claim 10, wherein the negatively charged ions comprise fluorine, oxygen, hydrogen, nitrogen, chlorine, bromine and/or sulfur.

15. The field effect transistor of claim 10, wherein the dielectric region comprises aluminum oxide, silicon oxide, silicon oxynitride, aluminum nitride, hafnium oxide, and/or silicon nitride.

16. The field effect transistor of claim 11, wherein the field effect transistor is an enhancement mode transistor.

17. The field effect transistor of claim 16, wherein the field effect transistor has a threshold voltage of at least 0.5 V.

18. A field effect transistor, comprising:
a source;
a drain;
a gate;
a semiconductor region under the gate; and
a dielectric region between the gate and the semiconductor region, wherein the dielectric region has a first surface on a first side of the dielectric region nearest the gate and a second surface on a second side of the dielectric region nearest the semiconductor region, wherein at least a portion of the dielectric region comprises negatively charged ions, wherein a concentration of the negatively charged ions in the at least a portion of the dielectric region increases with proximity to the semiconductor region,
wherein the concentration of the negatively charged ions is higher at the second surface than at the first surface and the concentration of the negatively charged ions at the first surface is nonzero.

19. The field effect transistor of claim 18, wherein the semiconductor region comprises a gallium nitride semiconductor material.

* * * * *